(12) United States Patent
Shibata

(10) Patent No.: US 6,815,829 B2
(45) Date of Patent: Nov. 9, 2004

(54) SEMICONDUCTOR DEVICE WITH COMPACT PACKAGE

(75) Inventor: Kazutaka Shibata, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

(21) Appl. No.: 09/959,746

(22) PCT Filed: Mar. 27, 2001

(86) PCT No.: PCT/JP01/02463
§ 371 (c)(1),
(2), (4) Date: Nov. 5, 2001

(87) PCT Pub. No.: WO01/73843
PCT Pub. Date: Apr. 10, 2001

(65) Prior Publication Data
US 2002/0158319 A1 Oct. 31, 2002

(30) Foreign Application Priority Data
Mar. 29, 2000 (JP) .......................................... 2000-92040

(51) Int. Cl.⁷ .............................................. H01L 23/48
(52) U.S. Cl. ...................................... 257/777; 257/778
(58) Field of Search ................................ 257/777, 778, 257/678, 680, 684, 686, 690, 706, 707, 731, 738

(56) References Cited

U.S. PATENT DOCUMENTS 6,084,308 A * 7/2000 Kelkar et al. ................ 257/777
6,150,724 A * 11/2000 Wenzel et al. ............... 257/777
6,239,484 B1 * 5/2001 Dore et al. ................... 257/687
6,380,631 B2 * 4/2002 Mess et al. ................... 257/777
6,462,420 B2 * 10/2002 Hikita et al. ................. 257/777
6,507,117 B1 * 1/2003 Hikita et al. ................. 257/778
6,525,413 B1 * 2/2003 Cloud et al. ................. 257/686
6,603,196 B2 * 8/2003 Lee et al. .................... 257/676
2002/0125581 A1 * 9/2002 Lin ............................. 257/778
2003/0193086 A1 * 10/2003 Adachi et al. ............... 257/710

FOREIGN PATENT DOCUMENTS

| JP | 04-207060 | 7/1992 |
| JP | 05-129516 | 5/1993 |
| JP | 09-082757 | 3/1997 |

* cited by examiner

Primary Examiner—Eddie Lee
Assistant Examiner—Douglas W. Owens
(74) Attorney, Agent, or Firm—Rabin & Berdo, P.C.

(57) ABSTRACT

In a semiconductor device having a structure in which a semiconductor chip is bonded to a surface of a solid device (a semiconductor chip, a wiring substrate or the like), the semiconductor device is thinned. A primary chip 31 and a secondary chip 32 are bonded together with the active surfaces thereof being opposed to each other to form a chip-on-chip structure. The primary chip 31 has bumps BE for outer connection on the outer side of the secondary chip 32. The bumps BE are connected to a surface of an interposed substrate 33. In the inner region of the interposed substrate 33, a through hole 40 for containing the secondary chip 32 is provided. A heat radiating plate 45 is bonded to the inert surface of the primary chip 31. The primary chip 31 and the secondary chip 32 can be well heat-radiated.

16 Claims, 3 Drawing Sheets

SEMICONDUCTOR DEVICE WITH COMPACT PACKAGE

BACKGROUND OF THE INVENTION

1. Field of the Invention

The present invention relates to a semiconductor device provided with a semiconductor chip and an interposed substrate having outer connecting terminals.

2. Description of Related Art

In order to raise the substantial integration degree of a semiconductor device, a semiconductor device having so-called a chip-on-chip structure has been proposed. On the other hand, in order to reduce the mounting area of a semiconductor device on a mounting substrate, an IC package has been developed, which is so-called a chip size package.

FIG. 4 is a schematic sectional view showing an example of a semiconductor device having a chip-on-chip structure packaged in a chip size package. A pair of semiconductor chips constituting the chip-on-chip structure include a primary chip 1 having pads 11 for outer connection and a secondary chip 2 to be bonded to the primary chip 1. The primary chip 1 and the secondary chip 2 are electrically and mechanically connected to each other by bumps 12, with active surfaces thereof being opposed to each other. On the active surface of the primary chip 1, pads 13 for outer connection are provided in the peripheral part away from the secondary chip 2 and are electrically connected through bonding wires 14 to an interposed substrate 3 called an interposer. The inert surface of the primary chip 1 is bonded onto a surface of the interposed substrate 3, for example, with an adhesive, and thereby the chip-on-chip structure is fixed on the surface of the interposed substrate 3.

On the interposed substrate 3, a mold resin 5 is disposed. Within the mold resin 5, the primary chip 1, secondary chip 2 and the bonding wires 14 are sealed. On the lower surface of the interposed substrate 3, which is the surface on the opposite side from the primary chip 1, a plurality of solder balls 15 serving as outer connecting terminals are two-dimensionally disposed in a grid-like arrangement. The semiconductor device is bonded to a mounting substrate by means of the solder balls 15.

FIG. 5 shows another example of a semiconductor device having a chip-on-chip structure. In this semiconductor device, the inert surface of a secondary chip 2 is bonded onto a primary chip 1, for example, with an adhesive. The primary chip 1 and the secondary chip 2 are electrically connected to each other by means of bonding wires 17.

A common problem of the structures shown in FIGS. 4 and 5 is that the semiconductor chips are stacked and therefore the height of each package is large. This problem can be reduced to some extent by grinding the mold resin 5 e.g. using a grinder as shown with a two-dots-and-dash line in FIG. 4, but the thinning of the package is limited.

In the case of the structure of FIG. 4, such grinding does not have so large an influence on the electric property of the device, even if the mold resin 5 is ground till the inert surface of the secondary chip 2 is exposed. However, in order not to hurt the bonding wires 14, such grinding of the mold resin 5 must be stopped at the time when the mold resin 5 still remains above the bonding wires 14.

In the case of the structure of FIG. 5, since the bonding wires 17 also electrically connect the primary chip 1 and the secondary chip 2 to each other, grinding of the mold resin 5 must be further limited.

On the other hand, in the structure of FIG. 4, if the mold resin 5 is ground till the inert surface of the secondary chip 2 is exposed, heat of the secondary chip 2 can be well radiated. On the contrary, since the interposed substrate 3 is present between the primary chip 1 and the outer space, heat of the primary chip 1 cannot be easily radiated. Therefore, when an element generating a large amount of heat such as a driving transistor is contained in the primary chip 1, such difficulty in heat radiation has a disadvantageous influence on not only the operational property of the primary chip 1 but also the property of the secondary chip 2.

SUMMARY OF THE INVENTION

An object of the present invention is to provide a semiconductor device having a semiconductor chip bonded onto a surface of a solid device, and capable of effectively reducing the thickness thereof.

A semiconductor device according to the present invention comprises (i) a semiconductor chip, (ii) a solid device provided with a bonding surface including a chip bonding region for bonding the semiconductor chip thereon and an outer connecting portion provided outside the chip bonding portion, and (iii) an interposed substrate having a containing portion capable of containing the semiconductor chip, a connecting portion to be bonded with the outer connecting portion, the connecting portion being provided in a peripheral part of the containing portion on a first surface opposed to the bonding surface, and outer connecting terminals provided on a second surface on the opposite side of the first surface.

With this structure, the semiconductor chip is contained in the containing portion provided in the first surface of the interposed substrate. The solid device bonded to the semiconductor device in this state is electrically connected to the connecting portion of the interposed substrate through the outer connecting portion provided on the outer side of the chip bonding region. Thereby, since the semiconductor chip is contained with the use of the thickness of the interposed substrate, the whole thickness of the semiconductor device can be reduced.

Further, since the surface, on the opposite side from the bonding surface, of the solid device is not opposed to the interposed substrate, heat can be well radiated from this surface. By mounting a heat radiating plate on this surface at need, the heat radiating efficiency can be further increased.

The solid device may be another semiconductor chip or a wiring substrate. The containing portion may be a containing recess provided in the first surface of the interposed substrate or a through hole penetrating through the interposed substrate.

The semiconductor chip may be bonded to the surface of the solid device in the facedown posture with the active surface thereof being opposed to the surface of the solid device. Further, the semiconductor chip may be bonded to the surface of the solid device in the faceup posture with the inert surface thereof being opposed to the surface of the solid device.

In order to execute facedown bonding, the semiconductor device may be bonded to the solid device by providing bumps respectively on the active surface of the semiconductor device and the bonding surface of he solid device and then bonding the bumps together. Further, in order to execute faceup bonding, the active surface of the semiconductor device and the solid device may be electrically connected using bonding wires.

Since the interposed substrate has outer connecting terminals on the second surface thereof on the opposite side of the first surface, the semiconductor device can be mounted on a mounting substrate using the outer connecting terminals. In this case, the outer connecting terminals may be in a land grip array in which a plurality of conductor patterns are exposed in a grid like arrangement, or in a ball grid array in which conductive members such as solders are disposed respectively on the plurality of conductor patterns formed on the second surface.

The solid device and the interposed substrate are preferably bonded by wireless bonding which directly bonds the outer connecting portion of the solid device and the connecting portion on the first surface of the interposed substrate. In this case, both or either of the outer connecting portion and the connecting portion preferably comprises a bump.

The foregoing and other objects, features, aspects and advantages of the present invention will become more apparent from the following detailed description of the present invention when taken in conjunction with the accompanying drawings.

DETAILED DESCRIPTION OF THE EMBODIMENTS

Figure 1:
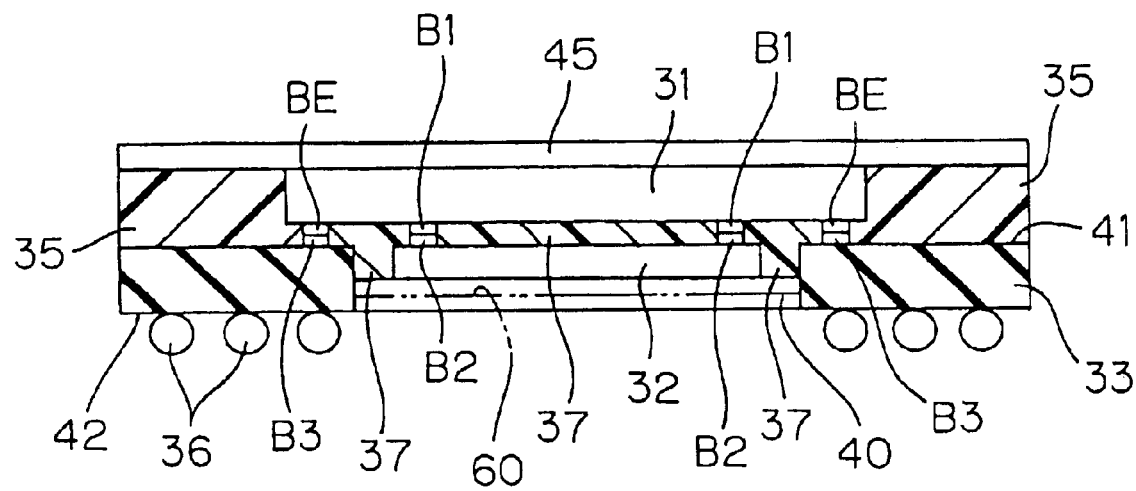
FIG. 1 is a schematic sectional view for explaining the structure of a semiconductor device according to a first embodiment of the present invention.

FIG. 1 is a schematic sectional view for explaining the structure of a semiconductor device of a first embodiment of the present invention. This semiconductor device is a chip size package type semiconductor device having a chip-on-chip structure. That is, the semiconductor device has an inner structure in which a pair of semiconductor chips including a primary chip (a solid device) 31 and a secondary chip (semiconductor chip) 32 are stacked.

A plurality of bumps B1 serving as chip connecting portions are provided on an active surface (bonding surface) of a primary chip 31, and further, a plurality of bump BE serving as outer connecting portions are provided in the peripheral region thereof. The primary chip 31 is a substantially rectangular plate-shaped member in plan view, and in an inner region thereof, a chip-bonding region provided with the bumps B1 are set. In this chip bonding region, the secondary chip 32 is bonded in so-called a facedown posture with the active surfaces of the primary chip 31 and the secondary chip 32 being opposed to each other. On the active surface of the secondary chip, bumps B2 are provided in positions corresponding to the bumps B1 of the primary chip 31. By bonding the bumps B1 and the bumps B2 to one another, the primary chip 31 and the secondary chip 32 are electrically and mechanically connected.

Figure 2:
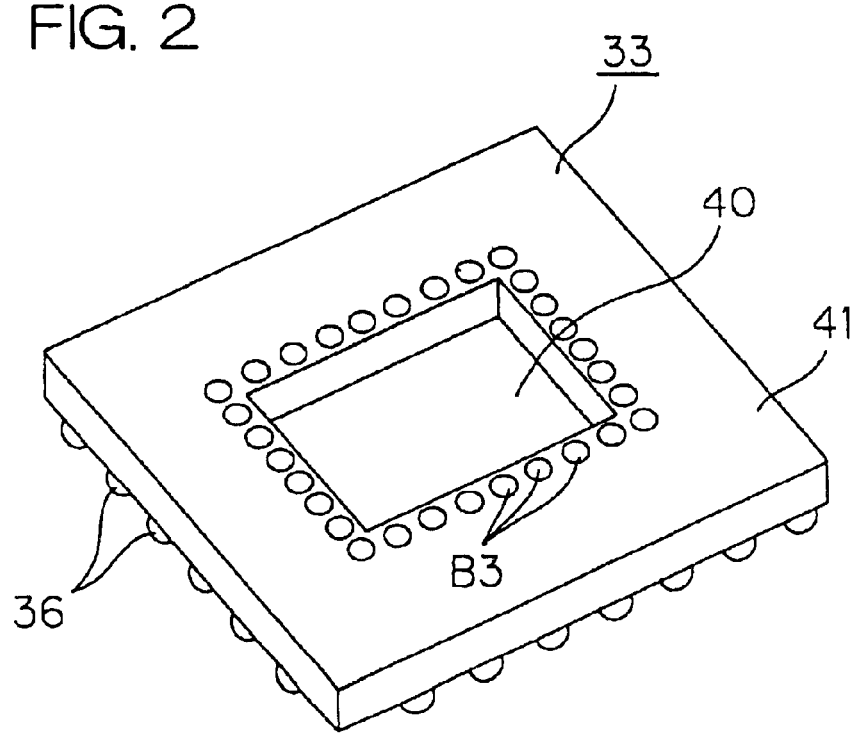
FIG. 2 is a perspective view for explaining the structure of an interposed substrate.
Figure 3:
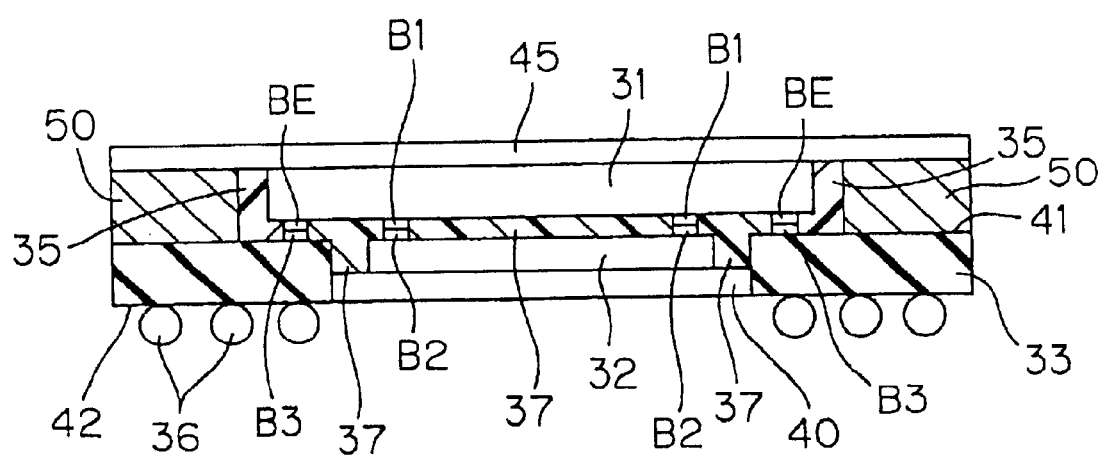
FIG. 3 is a schematic sectional view for explaining the structure of a semiconductor device according to a second embodiment of the present invention.
Figure 4:
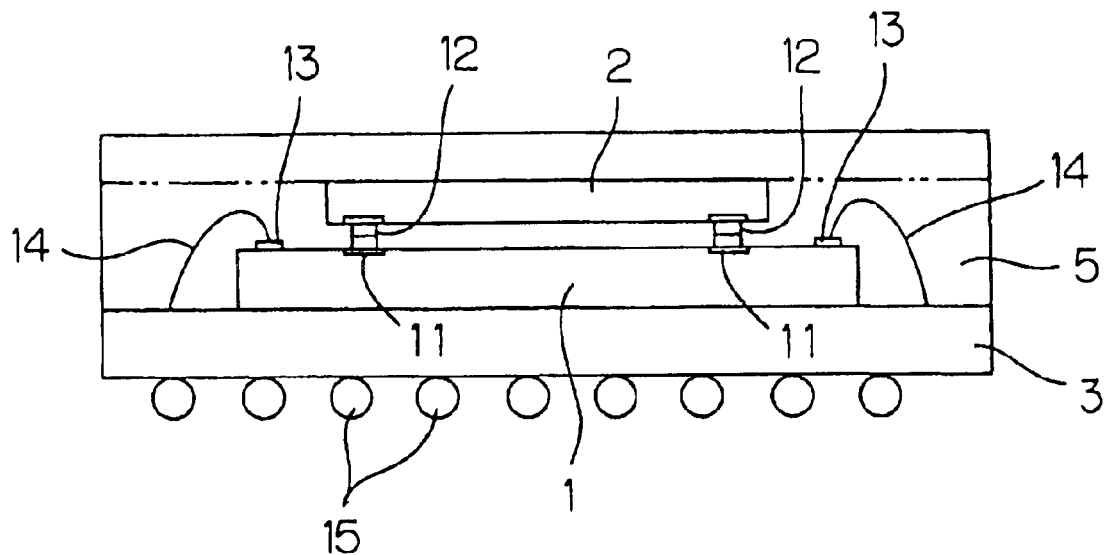
FIG. 4 is a schematic sectional view for explaining the structural example of a conventional chip-size packaged type semiconductor device having a chip-on-chip structure.
Figure 5:
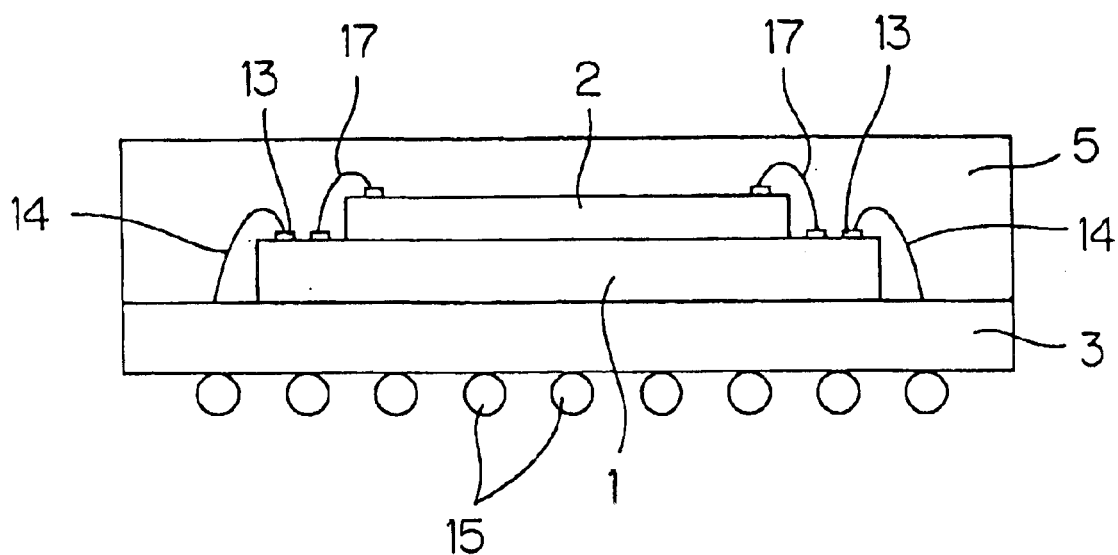
FIG. 5 is a schematic sectional view for explaining another conventional art.

The bumps BE for outer connection provided on the primary chip 31 are bonded to bumps B3 provided on the surface of an interposed substrate 33 called an interposer. As shown in the perspective view of FIG. 2, the interposed substrate 33 is substantially in a shape of a rectangular plate, and provided, in the inner region thereof, with a rectangular through hole 40 serving as a containing portion for containing the secondary chip 32. At the periphery of the through hole 40, a plurality of bumps B3 are provided on the first surface 41 opposed to the primary chip 31.

On the second surface 42 of the interposed substrate 33, which is the surface on the opposite side of the primary chip 31, a plurality of solder balls 36 serving as outer connecting terminals are two-dimensionally disposed in a grid-like arrangement. Inside the interposed substrate 33, inner wirings (not shown) respectively connecting the bumps B3 and the solder balls 36 are provided.

Onto the inert surface of the primary chip 1, a heat radiating plate 45 made of a metal such as aluminum is bonded. The heat radiating plate 45 protrudes from the inert surface of the primary chip 1, and has substantially the same shape and area with those of the interposed substrate 33. Between the protruding region of the heat radiating plate 45 protruding from the inert surface of the primary chip 1 and the interposed substrate 33, a mold resin 35 made of, for example, a thermoset resin is provided. The mold resin 35 serves to protect the active surfaces of the primary chip 31 and the secondary chip 32 respectively from the outer space and at the same time to increase the strength of the whole package.

Further, a resin 37 is provided between the primary chip 31 and the secondary chip 32, and between the inner wall of the through hole 40 and the side surface of the secondary chip 32. The resin 37 can be disposed at these positions, for example, by injecting a liquid resin using so-called capillary action and then hardening the same.

In a semiconductor device according to the first embodiment of the present invention, the bumps BE for outer connection of the primary chip 31 are bonded to the bumps B3 provided on the interposed substrate 33 with the secondary chip 32 being contained in the through hole 40 provided in the interposed substrate 33 as mentioned above. Thereby, the secondary chip 32 can be contained by utilizing the thickness of the interposed substrate 33, and the thickness of the whole package can be reduced. Moreover, the inert surface of the secondary chip 32 is exposed to the outer space, and the heat radiating plate 45 exposed to the outer space 45 is bonded to the inert surface of the primary chip 31. As a result, the heat generated from the primary chip 31 and the secondary chip 32 can be well radiated. Consequently, for example, if an element generating a large amount of heat such as a driving transistor is contained in the primary chip 31, the operational properties of the primary chip 31 and the secondary chip 32 can be prevented from being degraded by heat generated from such an element.

Further, the package can be made thinner by grinding the inert surfaces of the primary chip 31 and the secondary chip 32 to thin the primary chip 31 and the secondary chip 32. For example, by grinding the inert surfaces of the primary chip 31 and the secondary chip 32 by a grinder after bonding the primary chip 31 and the secondary chip 32 in a facedown posture to each other, the obtained chip-on-chip structure can be thinned and the whole package can become of a thin type.

The bumps B1, B2 can be bonded together by pressing the primary chip 31 and the secondary chip 32 in the direction bringing them close to each other, and at the same time applying ultrasonic wave oscillation to them and/or heating the bonded portions. Similarly, the bumps BE, B3 can be bonded together by pressing the primary chip 31 and the interposed substrate 33 in the direction bringing them close to each other, and at the same time applying ultrasonic wave oscillation to them and/or heating the bonded portions. In addition to the abovementioned direct bonding methods, the bumps B1 and B2, and the bumps BE and B3 can be bonded together respectively by interposing a metal having a low melting point (metal having a lower melting point than that of the material of the bumps, such as Sn) between the bumps, and heating the metal and the bumps. For example, when the bumps B1, B2, BE, B3 are made of gold (Au), by interposing Sn between the bumps and heating the same, a eutectic alloy of Au—Sn is produced and the bumps are bonded together respectively.

It is preferable that especially the bumps B1, B2 are not directly bonded together but are bonded with a metal having a low melting point therebetween. According to such a bonding method, pressure is not applied to regions just below the bumps B1 and B2 at the time of bonding, and therefore, elements can be formed even in these regions of the primary chip 31 and secondary chip 32.

Generally, the regions of the bumps BE for outer connection are not element forming regions. Consequently, there is no active reason to use a metal having a low melting point for bonding the bumps BE and the bumps B3 of the interposed substrate 33 to each other. Since heat used for melting the metal having a low melting point is apt to warp the interposed substrate 33, it is rather preferable that the bumps BE, B3 are directly bonded to each other.

One embodiment of the present invention has been explained in the above. However, the present invention can be embodied in other forms. For example, though the heat radiating plate 45 is bonded to the inert surface of the primary chip 31 in the abovementioned embodiment, it is not necessary to provide the heat radiating plate 45 if sufficient radiating effect can be obtained by exposing the inert surface of the primary chip 31 directly to the outer space. Further, in the abovementioned embodiment, the heat radiating plate 45 has substantially the same size with that of the interposed substrate 33, and the mold resin 35 is disposed between the heat radiating plate 45 and the interposed substrate 33. However, such a mold resin 35 is not necessarily disposed but the active surfaces of the primary chip 31 and the secondary chip 32 may be protected by using only the resin 37 for sealing between the primary chip 31 and secondary chip 32. Such a structure is preferably adopted especially when the heat radiating plate 45 is not used.

Further, instead of disposing only the mold resin 35 between the protruding region of the heat radiating plate 45 and the interposed substrate 33, a metal frame 50 may be disposed in place of or with the mold resin 35 to strengthen the protection of the interposed substrate 33.

Furthermore, in the abovementioned embodiment, a plurality of solder balls 36 are disposed in a grid-like arrangement to form a ball grid array on the second surface 42 of the interposed substrate 33. However, instead of disposing the solder balls 36, a plurality of conductor patterns may be exposed in a grid-like arrangement on the second surface 42 to form so-called a land grid array.

Further, in the abovementioned embodiment, the primary chip-31 and the secondary chip 32 are bonded together with the active surfaces thereof being opposed to each other. However, a chip-on-chip structure may be formed by so-called faceup bonding, that is, by bonding the inert surface of the secondary chip 32 onto the active surface of the primary chip 31 e.g. with an adhesive. In this case, connecting pads provided on the active surface of the secondary chip 32 and connecting pads provided on the surface of the primary chip 31 may be electrically connected to each other e.g. by bonding wires. In this case, it is also preferable to provide bumps for outer connection at the peripheral part of the primary chip 31, and directly connecting the bumps to the bumps B3 provided on the surface of the interposed substrate 33.

Furthermore, in the abovementioned embodiment, the through hole 40 is provided in the interposed substrate 33, and the secondary chip 32 is contained in the through hole 40. However, if the thickness of the interposed substrate 33 is rather large, it is possible to provide a recess 60 (shown with an imaginary line in FIG. 1), having a depth capable of containing the secondary chip 32, on the first surface 41 side of the interposed substrate 33. But if the heat radiation of the secondary chip 32 is important, it is preferable to provide such a through hole 40 as adopted in the abovementioned embodiment in the interposed substrate 33 to expose the secondary chip 32 to the outer space.

Although the present invention has been described and illustrated in detail, it is clearly understood that the same is by way of illustration and example only and is not to be taken by way of limitation, the spirit and scope of the present invention being limited only by the terms of the appended claims.

This application corresponds to the Japanese Patent Application No.2000-92040 filed in the Japan Patent Office on Mar. 29, 2000, and the whole disclosures of the Japanese application are incorporated herein by reference.

What is claimed is:

1. A semiconductor device comprising:

a semiconductor chip, a solid device provided with a bonding surface including a chip bonding region for bonding the semiconductor chip thereon and an outer connecting portion provided outside the chip bonding portion, the solid device additionally being provided with another surface on the opposite side from the bonding surface, an interposed substrate having a containing portion capable of containing the semiconductor chip, a connecting portion to be bonded to the outer connecting portion, the connecting portion of the interposed substrate being provided adjacent a peripheral part of the containing portion on a first surface opposed to the bonding surface, and outer connecting terminals provided on a second surface on the opposite side from the first surface, a heat radiating plate mounted on the another surface of the solid device, and having a protruding region that protrudes from the another surface, and mold resin disposed in a space defined between the protruding region of the heat radiating plate and the interposed substrate, the mold resin filling the space as so to directly contact both the heat radiating plate and the interposed substrate.

2. A semiconductor comprising:

a semiconductor chip, a solid device provided with a bonding surface including a chip bonding region for bonding the semiconductor chip thereon and an outer connecting portion provided outside the chip bonding portion, the solid device additionally being provided with another surface on the opposite side from the bonding surface.

an interposed substrate having a containing portion capable of containing the semiconductor chip, a connecting portion to be bonded to the outer connecting portion, the connecting portion of the interposed substrate being provided adjacent a peripheral part of the containing portion on a first surface opposed to the bonding surface, and outer connecting terminals provided on a second surface on the opposite side from the first surface, a heat radiating plate mounted on the another surface of the solid device, and having a protruding region that protrudes from the another surface, and a metal frame that is interposed between the protruding region of the heat radiating plate and the interposed substrate, the metal frame directly contacting both the heat radiating plate and the interposed substrate.

3. A semiconductor device as claimed in claim 1, in which the solid device is another semiconductor chip.

4. A semiconductor device as claimed in claim 1, in which the containing portion is a containing recess provided in the first surface of the interposed substrate or a through hole penetrating through the interposed substrate.

5. A semiconductor device as claimed in claim 1, in which the semiconductor chip is bonded to the solid device in the facedown posture with the active surface thereof being opposed to the bonding surface of the solid device.

6. A semiconductor device as claimed in claim 5, in which bumps are provided respectively on the active surface of the semiconductor chip and the bonding surface of the solid device, and the bumps are bonded together.

7. A semiconductor device as claimed in claim 6, in which the bumps are bonded together through a eutectic alloy formed of a metal having a low melting point and a bump material.

8. A semiconductor device as claimed in claim 1, in which the outer connecting portion of the solid device and the connecting portion on the first surface of the interposed substrate are directly bonded by wireless bonding.

9. A semiconductor device as claimed in claim 1, in which at least either of the outer connecting portion of the interposed substrate comprises a bump.

10. A semiconductor device as claimed in claim 2, in which the solid device is another semiconductor chip.

11. A semiconductor device as claimed in claim 2, in which the containing portion is a containing recess provided in the first surface of the interposed substrate or a through hole penetrating through the interposed substrate.

12. A semiconductor device as claimed in claim 2, in which the semiconductor chip is bonded to the solid device in a facedown posture, with the active surface of the semiconductor chip facing away from the bonding surface of the solid device.

13. A semiconductor device as claimed in claim 12, in which bumps are provided respectively on the active surface of the semiconductor chip and the bonding surface of the solid device, and the bumps are bonded together.

14. A semiconductor device as claimed in claim 13, in which the bumps are bonded together through a eutectic alloy formed of a metal having a low melting point and a bump material.

15. A semiconductor device as claimed in claim 2, in which the outer connecting portion of the solid device and the connecting portion on the first surface of the interposed substrate are directly bonded by wireless bonding.

16. A semiconductor device as claimed in claim 2, in which at least either of the outer connecting portion of the interposed substrate comprises a bump.

* * * * *